United States Patent [19]

Shimauchi et al.

[11] Patent Number: 4,959,278
[45] Date of Patent: Sep. 25, 1990

[54] TIN WHISKER-FREE TIN OR TIN ALLOY PLATED ARTICLE AND COATING TECHNIQUE THEREOF

[75] Inventors: Hidenori Shimauchi, Takatsuki; Keijiro Suzuki, Tokyo, both of Japan

[73] Assignee: Nippon Mining Co., Ltd., Japan

[21] Appl. No.: 363,615

[22] Filed: Jun. 8, 1989

[30] Foreign Application Priority Data

Jun. 16, 1988 [JP] Japan .................. 63-146772
Jun. 16, 1988 [JP] Japan .................. 63-146894
Jun. 16, 1988 [JP] Japan .................. 63-146895

[51] Int. Cl.$^5$ ............... B32B 15/00; C25D 5/10; C25D 5/50
[52] U.S. Cl. ................... 428/642; 428/646; 428/647; 204/37.3; 204/40
[58] Field of Search ............ 428/642, 646, 647, 935, 428/936; 204/37.1, 40, 54.1, 54.5, 37.3; 427/437, 98; 206/328, 330

[56] References Cited

U.S. PATENT DOCUMENTS

| | | | |
|---|---|---|---|
| 3,585,010 | 6/1971 | Luce | 428/642 |
| 3,857,683 | 12/1974 | Castonguay | 428/642 |
| 3,908,075 | 9/1975 | Jackson et al. | 174/68.5 |
| 4,010,005 | 3/1977 | Morisaki et al. | 428/642 |
| 4,255,474 | 3/1981 | Smith, Jr. | 428/642 |
| 4,511,634 | 4/1985 | Nickol | 428/642 |
| 4,577,056 | 3/1986 | Butt | 174/52.4 |
| 4,640,438 | 2/1987 | Trevisson et al. | 174/52.3 |
| 4,749,626 | 6/1988 | Kadija et al. | 427/437 |
| 4,808,769 | 2/1989 | Nakano et al. | 174/68.5 |
| 4,812,421 | 3/1989 | Jung et al. | 206/330 |

FOREIGN PATENT DOCUMENTS

| | | | |
|---|---|---|---|
| 1771954 | 11/1971 | Fed. Rep. of Germany. | |
| 52-36529 | 3/1977 | Japan | 204/40 |
| 52-67187 | 4/1982 | Japan | 428/647 |
| 59-5583 | 1/1984 | Japan | 428/642 |
| 59-93898 | 5/1984 | Japan | 204/54.1 |

OTHER PUBLICATIONS

Lyman, J., "Special Report: Film Carriers Star in High-Volume IC Production", Electronics/Dec. 25, 1975, pp. 65–68.
Angelucci, T., "Gang Lead Bonding Integrated Circuits", Solid State Technology/Jul. 1976, pp. 21–25.
Oswald, R. et al., "Automated Tape Carrier Bonding for Hybrids", Solid State Technology/Mar. 1978, pp. 39–48.
Grossman, S., "Film-Carrier Technique Automates the Packaging of IC Chips", Electronics/May 16, 1974, pp. 89–95.
Patent Abstracts of Japan, vol. 3, No. 118 (C-60), 4th Oct. 1979, p. 160, C 60; & JP-A-54 100 941 (Sumitomo Denki Kogyo K.K.) 08-09-1979.
Chemical Abstracts, vol. 80, No. 22, 3rd Jun. 1974, p. 469, Abstract No. 127422w, Columbus, Ohio, U.S.; V. A. Nikolaeva et al.: "Cathodic Deposition of Indium from Sulfate Solutions in the Presence of Thiourea", & Zh. Prikl. Khim (Leningrad), 1974, 47(1), 231-3.

Primary Examiner—John J. Zimmerman
Attorney, Agent, or Firm—Wood, Phillips, Mason, Recktenwald & VanSanten

[57] ABSTRACT

A tin or tin alloy plated article, particularly a film carrier which is protected against the generation of tin whiskers characterized in having an indium plated layer on the substrate thereof and a tin or tin alloy plated layer on said indium plated layer. There are also disclosed a coating process therefor as well as a novel and unique electroless indium plating bath therefor, said indium plating bath is an acidic, electroless plating bath characterized by including an indium salt and thiourea or a derivative thereof.

82 Claims, 1 Drawing Sheet

TIN WHISKER-FREE TIN OR TIN ALLOY PLATED ARTICLE AND COATING TECHNIQUE THEREOF

FIELD OF THE INVENTION

This invention relates to a tin whisker-free, tin or tin alloy plated article. This invention concerns with ornaments, electrical or electronical parts, structural components etc. which need the protection of tin or tin alloy plated surface against the generation of tin whiskers. This invention also relates to a coating or production process therefor as well as an electroless indium plating bath particularly useful therefor.

BACKGROUND OF THE INVENTION

Tin or tin alloy plating or coating which is low in cost, is resistant in corrosion and also is good in apPearance and further is excellent in solderability, is in wide use for the surface treatment or production of metal articles such as various ornaments, electrical or electronical parts typified by lead frames, printed circuit boards, contacting elements such as electrical contacts and terminals as well as structural members or parts of ferrous or ferrous alloy sheets or others.

Recently, as a method of mounting elements such as semiconductor chips, a packaging system called a film carrier (called also as a tape carrier) has been developed.

This film carrier system, as illustrated in FIG. 1, comprises a continious length of tape 2 having two rows of sproket holes along and adjacent the opposite edges thereof. The tape 2 consists of a base of a polyimide, polyester, polyether sulfone (PES), poly-parabonic acid (PPA) or other resin and a copper foil bonded onto the base. The copper foil is formed with inner leads 3 chip bonding fingers and outer leads 4 fingers for external connections by photoeching.

In the specification, micro patterns associated with the inner leads 3 and the outer leads 4 are collectively called "lead portion'.

As shown in FIG. 1, around a device hole formed by punching a central portion of the base for mounting a semiconductor chip or the like, inner leads formed from the copper foil are arranged in a high density so as to partially project into the device hole. The individual leads sometimes have a width as narrow as several ten microns.

In such fine patterns of the lead portion formed by etching the copper foil laminated on the film base as described above, tin or tin alloy plating is usually provided for the purpose of facilitating the bonding of the inner leads with a semiconductor chip bumps and of increasing the bonding strength therebetween and further for the purpose of enhancing the solderability of the outer leads.

However, tin or tin alloy plated articles have a serious problem that tin whiskers tin acicular crystals are liable to generate from the plated surfaces which can mar the appearance of ornaments and can cause shortings of electrical parts and can impair structural parts or the like.

To prevent this whisker generation, diverse methods have hitherto been proposed.

They include, for example, (1) heat treatment after tin plating as described in Japanese Patent Application Publication No. 47995/1981, (2) alloy coating, namely codeposition of tin with another metal such as lead, nickel, copper, bismuth, antimony etc. and (3) Periodic reversal of the polarity of the positive and negative electrodes involving in the plating or the use of ultrasonic energy to minimize the hydrogen occlusion in the plated metal.

These prior art approaches for preventing the generation of whiskers still have varied difficulties in practice.

For example, the method (1) requires much time for the treatment and has an upper limitation of temperature to be applicable because heating conditions sometimes can melt or soften a plastic base to deform it. Also, in the case where the heating is conducted in air, tin plated surface is oxidized, leading to decreased corrosion resistance and solderability of the surfaces of electronic parts. The method (2) has the possibilities of causing other problems or troubles due to decreased corrosion resistance and solderability or due to lowered electrical characteristics. The method (3) may be effective only when the whisker occurs by the influence of hydrogen occlusion, but is not effective when the whisker generation is caused by other factors.

Further, the applicant previously succeeded in preventing the whisker generation in connection with tin or tin alloy plated film carriers by plating an indium layer onto a tin or tin alloy plated layer, and have obtained good fruits as described in U.S. Ser. No. 282,183 filed on Dec. 9, 1988 or European Patent Application No. 88120838 Filed on Dec. 13, 1988.

However, there are many applications which require by all means that exposed surface layer is a tin or tin alloy layer.

OBJECT OF THE INVENTION

The present invention is aimed at the provision of a novel article having tin or tin alloy plating and its coating process wherein whisker generation may be prevented by easier and convenient means than in the above-mentioned methods (1) to (3) while maintaining the exposed outermost layer as tin or a tin alloy.

SUMMARY OF THE INVENTION

The applicant has previously made intensive studies as to an undercoat of tin or tin alloy plating for reducing or relieving any internal stress produced at the time of tin or tin alloy plating which may be a primary factor for whisker generation. Unexpectedly, the Applicant has now found that the use of indium is effective as undercoat for tin or tin alloy plating which is contrary to the previous Applicant's proposal. This is the basis on which the Present invention has developed.

Based on this finding, the present invention provides a tin or tin alloy plated article protected against the generation of tin whiskers characterized in that the article has an indium plated layer on its substrate and a tin or tin alloy plated layer formed on the indium plated layer. The present invention also provides a process of producing or coating therefor as well as a specific electroless indium plating bath useful therefor.

DETAILED DESCRIPTION OF THE INVENTION

Figure 1:
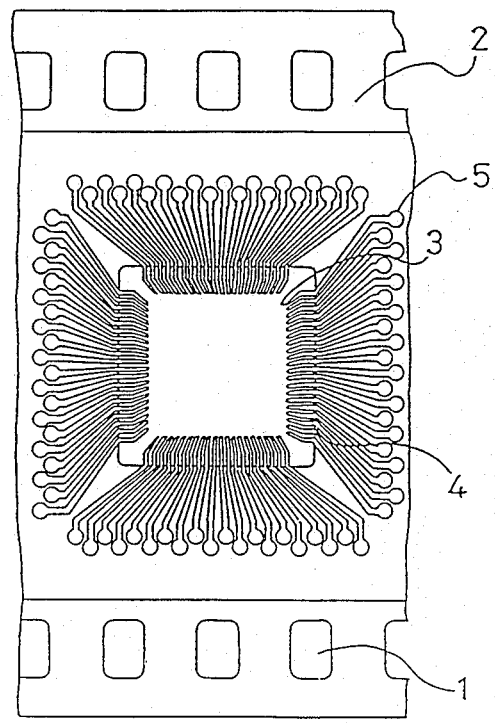
FIG. 1 is a top view of a typical film carrier in connection with the present invention.

The substrates to be used in the present invention are the same as those in conventional tin or tin alloy plated articles and the present invention is particularly suitable for the plating of metallic materials etc. including electrical or electronic components or parts such as film carriers for mounting semiconductor chips, printed circuit boards, lead frames, contacting elements such as contacts or terminals and plated structural members which demand good appearance and high operation reliability.

Such substrates include metallic materials such as iron and iron based alloy such as Kovar, 42 alloy, stainless steel etc. as well as copper and copper based alloy such as brass, red brass, nickel silver, phosphor bronze, zircon copper, titanium copper, tin containing copper etc. as well as composite materials having such metallic material laminated.

The thickness of each of plated layers is not specially limited, but generally the thickness of indium plated layer is at least $0.01 \mu m$, preferably at least $0.5 \mu m$. If the indium layer is less than $0.01 \mu m$ thick, it effect for preventing the generation of whiskers is inadequate. Its upper limit is not critical, but not more than $5 \mu m$ is desirable since the adherence of the plated layer is liable to decrease when its thickness is beyond $5 \mu m$. Indium is costly and therefore it will sufficient to have a thickness of not more than $1.0 \mu m$ in practical use under consideration of its cost. The thickness of the tin or tin alloy plated layer is 0.1 to $1.0 \mu m$, preferably 0.5 to $0.7 \mu m$. If the thickness is less than $0.1 \mu m$, the solderability is impaired. A thickness in excess of $1.0 \mu m$ is not particularly objectionable, but excessively thick plating is economically unwarranted and has a danger that the tine or tin alloy moltens causing a short circuit when a bonding process is subsequently conducted.

Electroplating bath for indium includes sulfuric acid bath, fluoborate bath, sulfamic acid bath, methanesulfonic acid bath and others. Electroless plating for indium is either an alkaline or acidic bath. While the plate bath and plating procedure is not particularly limited in the present invention, it is recommended to use an acidic bath for a composite substrate using a resin easily corrosive to an alkali such as a film carrier.

Typical indium electro- and electroless plating baths are as follows:

| Ex. 1: Indium electroplating bath | |
|---|---|
| Indium sulfate | 10–25 g/l |
| Sodium sulfate | 0–10 gl/ |
| Temperature | room temperature |
| pH | 2–2.7 |
| Cathode current density | 2–4 A/dm$^2$ |
| Ex. 2: Alkaline indium electroless plating bath | |
| Alkaline bath containing a sodium borohydride as a reducing agent | |
| Ex. 3: Acidic indium electroless plating bath | |
| Hydrochloric acid | 3% |
| Thiourea | 100 g/l |
| Indium chloride | 20 g/l |
| Temperature | 60° C. |
| Ex. 4: Acidic indium electroless plating bath | |
| sulfuric acid | 1.5% |
| Thiourea | 75 g/l |
| Indium sulfate | 10 g/l |
| Temperature | 60° C. |

Among them, the electroless indium plating baths as shown in Ex. 3 and Ex. 4 are novel plating baths which are acidic and by which the problems of conventional alkaline baths have been solved and which is excellent in the stability of the plating bath and is also high in deposition rate. They are suitable in the application where indium is plated on a copper surface of a film carrier having as a base a polyimide film which is weak to an alkali.

Now, explanations will be made as to this novel acidic indium electroless plating bath:

Acidic indium electroless plating bath

This plating bath is an acidic, electroless indium plating bath characterized by including an indium salt and thiourea or a derivative thereof. Unlike conventionally used alkaline bath containing a sodium borohydride as a reducing agent, this has unique characteristics in the points that is excellent in the stability of the plating bath, is high in deposition rate and is applicable to any parts including resin or the like poorly resistant to an alkali.

The indium salts for use in this plating bath may be any compound of indium with an inorganic or organic acid which is in the form of a solution at a pH of 3.0 or less and include e.g. $In_2(SO_4)_3$, $In(NO_3)_3$, $InCl_3$, indium fulmate or indium methanesulfonate.

The concentration of the indium salt in the plating bath ranges from 1 to 50 g/l, preferably from 10 to 20 g/l. If the concentration is less than 1 g/l, the deposition of indium does not take place, whereas at a concentration more than 50 g/l the deposition rate comes down although the plating itself is possible.

Useful derivatives of thiourea for use in this plating bath include 2,4-dithiobiuret and thiosemicarbazide.

The concentration of thiourea or its derivative in the plating bath is in the range of 50 to 200 g/l, preferably 60 to 100 g/l. With a concentration of less than 50 g/l indium deposition does not occur, while on the other hand a higher concentration above 200 g/l is not undesirable because it forms white floating (insoluble) matters.

This indium electroless plating bath has a pH of 3.0 or less, preferably 1.0 or less. When the pH exceeds 3.0, indium is transformed into a hydroxide, forming a precipitate. In view of this and also taking deposition rate into consideration, a pH of 1.0 or less is preferred.

The temperature of this plating bath is not critically limited, but from the standpoint of deposition rate it is preferable to adopt a temperature of 50° to 70° C.

This indium electroless plating bath performs an plating operation based on replacement type reaction with the use of no reducing agent. The bath is so stable that it basically does not require the addition of a stabilizer or complexing agent. However, where necessary, for example, for the purpose of stabilizing indium, copper and other metal ions in the plating bath and of ensuring the uniform deposition, one or two more compounds such as mentioned below may be used:

Examples of such compounds are aminocarboxylic acids such as ethylenediaminetetraacetic acid EDTA and derivatives thereof, nitrilotriacetic acid NTA and its derivatives etc., polycarboxylic acids such as tartaric acid and its derivatives, citric acid and its derivatives etc., organic compounds such as gelatine and surfactants such as polyalkylen glycols.

This indium electroless plating bath is used for plating indium on a metal less noble than indium as well as copper and copper alloys and is applicable to a glass, plastic ceramic or the like by precoating its surface with copper or by preliminarily covering its surface with a copper foil etc. with any known technique.

The functions of the plating operation with the use of this indium electroless plating bath will now be explained in connection with the case where copper or a copper alloy is substrate:

It will be generally thought that deposition of indium on copper or a copper alloy by replacement reaction is theoretically impossible because of their ionization tendency. However, according to the principle of this plating bath, the use of thiourea or its derivative shifts the dissolution potential of copper toward the less-noble direction rendering it less noble than the deposition potential of indium.

As the result, the progress of the replacement reactions may be effected as represented by the following formulas:

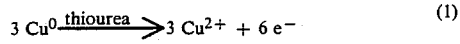  (1)

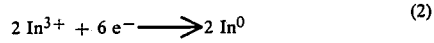  (2)

From the formulas (1) and (2),

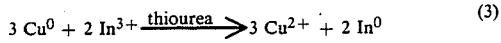  (3)

Also, because the complex formation constant of thiourea and $Cu^{2+}$ is high as indicated as follows $\beta_4:[CuL_4^*] = 15.4(25° C., 0.1N, KNO_3)$ *$L$=thiourea and therefore thiourea forms a stable complex with the $Cu^{2+}$ that has dissolved out by replacement reaction with indium, the reverse reaction of the formula (3) can be conveniently inhibited.

In addition to these actions, thiourea plays the role of a dissolution promotor for copper as indicated by the formula (3). Consequently, this plating bath has an advantage of remarkably high plating deposition rate about 4 to 10 times those of conventional alkaline plating baths.

Returning back to the explanations of the present invention, tin or tin alloy plating is formed on the indium plated layer thus produced. Various kinds of tin electroplating or electroless plating baths have been known and present invention is not limited to specific plating baths, but may employ the following plating baths for example:

Ex. 5 : Tin electroplating bath
Tin sulfate 40 g/l
Sulfuric acid : 100 g/l
Brightener AC (commercially saled product)
Temperature 20° C.
Cathode current density : 3 A/dm$^2$,
Ex. 6 : Tin electroless plating bath
"Tinposit LT-34 "(manufactured by Shipley Co.)
Liquid temperature : 50° C.

Indium, with a low melting point (156° C.), easily forms an alloy with tin or a tin alloy. Where necessary, therefore, it is further effective for preventing the whisker generation to heat treat the plated layer at a temperature low enough not to produce oxides on tin or tin alloy surface, namely 50 to 150° .

As described, it was been proofed that the platings of a substrate first by with indium and then with tin or a tin alloy prevent the formation of whiskers.

As the reasons why the generation of whiskers can be prevented according to the Present invention, it is presumably considered that the undercoat of tin or tin alloy plating has changed to a material which does not induce the whisker generation and that the internal stress of tin or tin alloy plated layer will be relaxed in view of the fact that indium and tin or tin alloy has diffused to each other to partially form an alloy.

For the purpose of the present invention, the tin alloys to be used includes Sn—Pb or other alloys which does not undergo any reduction in corrosion resistance or solderability.

EXAMPLES

The present invention is further illustrated by the following examples:

Example 1

The indium electroplating bath of Ex. 1 was used. A 0.4 mm thick copper sheet was made a cathode and an indium sheet was used as an anode. Current was passed across the cathode and anode for one minute to form an indium plated film of 0.05 μm thickness.

Next, using the tin electroplating bath of Ex. 5 with the use of a tin sheet as anode, current was passed for 3 minutes. A 0.65 μm thick tin plated film was formed on the indium undercoat.

The specimen so obtained was allowed to stand at 40° C. and 95% RH for one month. No whisker growth was obserbed.

Example 2

In the indium electroless plating bath of Ex. 3 was immersed a piece of 0.4 mm copper sheet for 5 minutes to form
film 0.5 μm thick. an indium plated This indium-undercoated sheet was immersed in the electroless plating bath of Ex. 6 to form a tin plated film of 0.65 μm thickness.

The specimen thus obtained was allowed to stand at 40 and 95% RH for one month. No whisker growth was obserbed.

Example 3

A copper foil 35μm in thickness was laminated onto an ordinary 35 μm wide film of a polyimide as a base and etched to produce a film carrier having microcircuits with a lead portion as shown in FIG. 1. This film carrier was immersd in the indium electroless plating bath of Ex. 3 for 5 minutes to form 0.5μm thick indium plated film on the lead portion. The film carrier was then immersed for 5 minutes in the abovementioned electroless tin plating bath Tinposit LT-34 of Shipley Co. to form a 0.5 μm tin plated film over the indium plated film.

The film carrier sample so obtained was kept at 40° C. and 95% RH for one month. No whisker growth was obserbed.

Comparative Example 1

Using the tin plating baths of Ex. 5 and Ex. 6, 0.65μm thick plated films were formed two copper sheets each having a thikness of 0.4 mm.

After standing the sheets at 40 and 95% RH for one week, it was shown that whiskers were generated in the number of more than 100 per square millimeter.

Comparative Example 2

A film carrier was made in the same way as described in Example 3 except that the indium plating was omitted.

After standing the film carrier at 40 and 95% RH for one week, it was shown that whiskers were generated in the number of more than 100 per square millimeter.

Advantages of the invention

As explained above, according to the present invention, the generation of whiskers in tin or a tin alloy plated articles can be easily prevented and hence shorting or other whisker related troubles can be precluded while maintaining not only good appearance of tin or tin alloy plated layer, but also good corrosion resistance and solderbility. In particular, this invention can furnish tin or tin alloy coated articles including electro and electronic parts having beautiful appearance and high reliability.

What is claimed is :

1. A tin or tin alloy plated article protected against the generation of tin whiskers characterized in having an indium plated layer on the substrate thereof and a tin or tin alloy plated layer on said indium plated layer.

2. A tin or tin alloy plated article protected against the generation of tin whiskers of the claim 1 wherein said substrate is selected from the group consisting of iron and iron based alloys as well as copper and copper based alloys.

3. A tin or tin alloy plated article protected against the generation of tin whiskers as in claim 2 wherein the thickness of said tin or tin alloy plated layer is in the range of 0.1 to 1.0 μm.

4. A tin or tin alloy plated article protected against the generation of tin whiskers as in claim 2 wherein the thickness of said tin or tin alloy plated layer is in the range of 0.5 to 0.7 μm.

5. A tin or tin alloy plated article protected against the generation of tin whiskers of the claim 1 wherein said substrate is a film carrier for mounting thereon electronic components such as semiconductor chips or the like.

6. A tin or tin alloy plated article protected against the generation of tin whiskers anyone of the claims 1 to 3 wherein the thickness of said indium plated layer is not less than 0.01 μm.

7. A tin or tin alloy plated article protected against the generation of tin whiskers as in claim 6 wherein the thickness of said tin or tin alloy plated layer is in the range of 0.1 to 1.0 μm.

8. A tin or tin alloy plated article protected against the generation of tin whiskers as in claim 6 wherein the thickness of said tin or tin alloy plated layer is in the range of 0.5 to 0.7 μm.

9. A tin or tin alloy plated article protected against the generation of tin whiskers anyone of the claims 1 to 3 wherein the thickness of said indium plated layer is not less than 0.05 μm.

10. A tin or tin alloy plated article protected against the generation of tin whiskers as in claim 9 wherein the thickness of said tin or tin alloy plated layer is in the range of 0.1 to 1.0 μm.

11. A tin or tin alloy plated article protected against the generation of tin whiskers as in claim 9 wherein the thickness of said tin or tin alloy plated layer is in the range of 0.5 to 0.7 μm.

12. A tin or tin alloy plated article protected against the generation of tin whiskers as in claim 5 wherein the thickness of said tin or tin alloy plated layer is in the range of 0.1 to 1.0 μm.

13. A tin or tin alloy plated article protected against the generation of tin whiskers as in claim 5 wherein the thickness of said tin or tin alloy plated layer is in the range of 0.5 to 0.7 μm.

14. A tin or tin alloy plated article protected against the generation of tin whiskers as in claim 1 wherein the thickness of said tin or tin alloy plated layer is in the range of 0.2 to 1.0 μm.

15. A tin or tin alloy plated article protected against the generation of tin whiskers as in claim 1 wherein the thickness of said tin or tin alloy plated layer is in the range of 0.5 to 0.7 μm. the generation of tin whiskers anyone of the claims 1 to 5 wherein the thickness of said tin or tin alloy plated layer is in the range of 0.1 to 1.0 μm.

16. A tin or tin alloy plated article protected against the generation of tin whiskers as in claim 1 wherein said substrate is a film carrier for mounting thereon semiconductor chips.

17. A process for producing a tin or tin alloy plated article protected against the generation of tin whiskers characterized in that indium is plated on the substrate thereof by electroplating or electroless plating and then a tin or a tin alloy is plated on said indium plated layer by electroplating or electroless plating.

18. A process as in claim 17 wherein said substrate is selected from the group consisting of iron and iron based alloys and copper and copper based alloys.

19. A process as in claim 18 wherein the thickness of said tin or tin alloy plated layer is in the range of 0.1 to 1.0 μm.

20. A process as in claim 18 wherein the thickness of said tin or tin alloy plated layer is in the range of 0.5 to 0.7 μm.

21. A process as in claim 9 wherein after said tin or tin alloy plating, heat treatment is conducted at 50 to 150 C.

22. A process as in claim 18 wherein said indium plating is conducted using an acidic, electroless plating bath including an indium salt and thiourea or a derivative thereof.

23. A process as in claim 17 wherein said substrate is a film carrier for mounting thereon electronic components.

24. A process as in claim 23 wherein the thickness of said tin or tin alloy plated layer is in the range of 0.1 to 1.0 μm.

25. A process as in claim 23 wherein the thickness of said tin or tin or tin alloy plated layer is in the range of 0.5 to 0.7 μm.

26. A process as in claim 23 wherein after said tin or tin alloy plating, heat treatment is conducted at 50 to 150° C.

27. A process as in claim 23 wherein said indium plating is conducted using an acidic, electroless plating bath including an indium salt and thiourea or a derivative thereof.

28. A process as in claim 23 wherein indium is plated on the substrate by electroless plating and then tin or a tin alloy is plated on aid indium plated layer by electroless plating.

29. A process as in claim 28 wherein the thickness of said tin or tin alloy plated layer is in the range of 0.5 to 0.7 μm.

30. A process as in claim 28 wherein after said tin or tin alloy plating, heat treatment is conducted at 50 to 150° C.

31. A process as in claim 28 wherein said indium plating is conducted using an acidic, electroless plating bath including an indium salt and thiourea or a derivative thereof.

32. A process as in anyone of the claims 17 to 28 wherein the thickness of said indium plated layer is not less than 0.01 μm.

33. A process as in claim 32 wherein the thickness of said tin or tin alloy plated layer is in the range of 0.1 to 1.0 μm.

34. A process as in claim 32 wherein the thickness of said tin or tin alloy plated layer is in the rage of 0.5 to 0.7 μm.

35. A process as in claim 32 wherein after said tin or tin alloy plating, heat treatment is conducted at 50 to 150°C.

36. A process as in claim 32 wherein after said indium plating is conducted using an acidic, electroless plating bath including an indium salt and thiourea or a derivative thereof.

37. A process as in anyone of the claims 17 to 28 wherein the thickness of said indium plated layer is not less than 0.05 μm.

38. A. process as in claim 37 wherein the thickness of said tin or tin alloy plated layer is in the range of 0.1 to 1.0 82 m.

39. A process as in clam 37 wherein the thickness of said tin or tin alloy plated layer is in the range of 0.5 to 0.7 μm.

40. A process as in claim 37 wherein after said tin or tin alloy plating, heat treatment is conducted at 50 to 150 C.

41. A process as in claim 37 wherein said indium plating is conducted using an acidic, electroless plating bath including an indium salt and thiourea or a derivative thereof.

42. A process as in claim 17 wherein said substrate is a film carrier for mounting thereon semiconductor chips.

43. A process as in claim 17 wherein the thickness of said tn or tin alloy plated layer is in the range of 0.1 to 1.0 μm.

44. A process as in claim 43 wherein after said tin or tin alloy plating, heat treatment is conducted at 50 to 150 C.

45. A process as in claim 43 wherein said indium plating is conducted using an acidic, electroless plating bath including an indium salt and thiourea or a derivative thereof.

46. A process as in claims 17 wherein the thickness of said tin or tin alloy plated layer is in the range of 0.5 to 0.7 μm.

47. A process as in claim 46 wherein after said tin or tin alloy plating, heat treatment is conducted at 50 to 150° C.

48. A process as in claim 46 wherein said indium plating is conducted using an acidic, electroless plating bath including an indium salt and thiourea or a derivative thereof.

49. A process as in claim 17 wherein after said tin or tin alloy plating, heat treatment is conducted at 50 to 150° C.

50. A process as in claim 49 wherein said indium plating is conducted using an acidic, electroless plating bath including an indium salt and thiourea or a derivative thereof.

51. A process as in claim 17 wherein said indium plating is conducted using an acidic, electroless plating bath including an indium salt and thiourea or a derivative thereof.

52. A process as in claim 51 wherein said indium plating is conducted using an acidic, electroless plating bath including 1 to 50 g/l of an indium salt and 50 to 200 g/l of thiourea or a derivative thereof and having a pH of 3 or less.

53. A process as in claim 51 wherein said indium plating is conducted using an acidic, electroless plating bath including 10 to 20 g/l of an indium salt and 60 to 100 g/l of thiourea or a derivative thereof and having a pH of 1 or less.

54. A method for plating tin or a tin alloy on a substrate while protecting against the generation of tin whiskers characterized in that indium is plated as an undercoat on the substrate by electroplating or electroless plating before said tin or tin alloy plating.

55. A method as in claim 54 wherein said substrate is a film carrier for mounting thereof semiconductor chips.

56. A method as in claim 54 wherein wherein said substrate is selected from the group consisting of iron and iron based alloys as well as copper and copper based alloys.

57. A method as in claim 56 wherein after said tin or tin alloy plating, heat treatment is conducted at 50 to 150° C.

58. A method as in claim 56 wherein said indium plating is conducted using an acidic, electroless plating bath including an indium salt and thiourea or a derivative thereof.

59. A method as in claim 54 wherein after said tin or tin alloy plating, heat treatment is conducted at 50 to 150° C.

60. A method as in claim 59 wherein said indium plating is conducted using an acidic, electroless plating bath including an indium salt and thiourea or a derivative thereof.

61. A method as in claim 65 wherein said indium plating is conducted using an acidic, electroless plating bath including an indium salt and thiourea or a derivative thereof.

62. A method as in claim 61 wherein said indium plating is conducted using an acidic, electroless plating bath including 1 to 50 g/l of an indium salt and 50 to 200 g/l of thiourea or a derivative thereof and having a pH of 3 or less.

63. A method is in claim 62 wherein said indium plating is conducted using an acidic, electroless plating bath including 10 to 20 g/l of an indium salt and 60 to 100 g/l of thiourea or a derivative thereof and having a pH of 1 or less.

64. A method as in claim 54 wherein said substrate is a film carrier for mounting thereon electronic components.

65. A method as in claim 64 wherein said indium plating is conducted using an acidic, electroless plating bath including an indium salt and thiourea or a derivative thereof.

66. A method as in claim 64 wherein after said tin or tin alloy plating, heat treatment is conducted at 50 to 150° C.

67. A method as in claim 64 wherein indium is plated on the substrate by electroless plating and tin or tin alloy is plated plated layer by electroless plating.

68. A method as in claim 67 wherein after said tin or tin alloy plating, heat treatment is conducted at 50 to 150° C.

69. A method as in claim 67 wherein said indium plating is conducted using an acidic, electroless plating bath including an indium salt and thiourea or a derivative thereof.

70. A method as in anyone of the claims 54 to 26 wherein the thickness of said indium plated layer is not less than 0.01 μm.

71. A method as in claim 70 wherein after said tin or tin alloy plating, heat treatment is conducted at 50 to 150° C.

72. A method as in claim 70 wherein said indium plating is conducted using an acidic, electroless plating bath including an indium salt and thiourea or a derivative thereof.

73. A method as in anyone of the claims 54 to 67 wherein the thickiness of said indium plated layer is not less than 0.05 μm.

74. A method as in claim 73 wherein after said tin or tin alloy plating, heat treatment is conducted at 50 to 150° C.

75. A method as in claim 73 wherein said indium plating is conducted using an acidic, electroless plating bath including an indium salt and thiourea or a derivative thereof.

76. A method as in anyone of teh claims 54 to 67 wherein the the thickness of said said tin or tin alloy plated layer is in the range of 0.1 to 1.0 μm.

77. A method as in claim 76 wherein after said tin or tin alloy plating, heat treatment is conducted at 50 to 150° C.

78. A method as in claim 76 wherein said indium plating is conducted using an acidic, electroless plating bath including an indium salt and thiourea or a derivative thereof.

79. A method as in anyone of teh claims 54 to 67 wherein the thickness of said tin or tin alloy plated layer is in the range of 0.5 to 0.7 μm.

80. A method as in claim 79 wherein after said tin or tin alloy plating, heat treatment is conducted at 50 to 150° C.

81. A method as in claim 79 wherein said indium plating is conducted using an acidic, electroless plating bath including an indium salt and thiourea or a derivative thereof.

82. A process as in claim 28 wherein the thickness of said tin or tin alloy plated layer is in the range of 0.1 to 1.0 μm.

* * * * *